US007312658B2

(12) United States Patent
Gatti et al.

(10) Patent No.: US 7,312,658 B2
(45) Date of Patent: Dec. 25, 2007

(54) DIFFERENTIAL AMPLIFIER WITH TWO OUTPUTS AND A SINGLE INPUT OF IMPROVED LINEARITY

(75) Inventors: Paolo Gatti, Grenoble (FR); Marc Sabut, Eybens (FR)

(73) Assignee: STMicroelectronics SA (FR)

( * ) Notice: Subject to any disclaimer, the term of this patent is extended or adjusted under 35 U.S.C. 154(b) by 169 days.

(21) Appl. No.: 11/096,798

(22) Filed: Mar. 31, 2005

(65) Prior Publication Data
US 2005/0218981 A1 Oct. 6, 2005

(30) Foreign Application Priority Data
Mar. 31, 2004 (FR) .................................. 04 50641

(51) Int. Cl.
*H03F 3/45* (2006.01)
(52) U.S. Cl. ........................ 330/253; 330/258; 330/259
(58) Field of Classification Search ................ 330/253, 330/258, 259
See application file for complete search history.

(56) References Cited

U.S. PATENT DOCUMENTS

| 3,786,362 | A | * | 1/1974 | Marsh et al. ................ 330/258 |
| 5,703,532 | A | * | 12/1997 | Shin et al. ................... 330/253 |
| 6,052,025 | A |   | 4/2000 | Choi et al. |
| 6,229,273 | B1 | * | 5/2001 | Kelly et al. ................. 318/254 |
| 6,329,849 | B1 |   | 12/2001 | Ishii et al. |
| 6,359,510 | B1 | * | 3/2002 | Ishii et al. .................. 330/253 |

FOREIGN PATENT DOCUMENTS

| EP | 0 318 263 A | 5/1989 |
| EP | 0 520 751 A | 12/1992 |

OTHER PUBLICATIONS

Larsen F. et al., "The Design of High Performance Low Cost BiCMOS Op-amps in a Predominantly CMOS Technology", 1995 IEEE International Symposium on Circuits and Systems (ISCAS), Seattle, Apr. 30-May 3, 1995, International Symposium on Circuits and Systems (ISCAS), New Yourk, IEEE, US, vol. 3, Apr. 30, 1995, pp. 1720-1723.

* cited by examiner

*Primary Examiner*—Patricia Nguyen
(74) *Attorney, Agent, or Firm*—Lisa K. Jorgenson; Bryan Santarelli; Graybeal Jackson Haley LLP

(57) ABSTRACT

A differential amplifier having a first and second output terminals and receiving an input signal at an input terminal. The amplifier comprises a first amplifier having a first input connected to the input terminal, a second input and a first output connected together to the first output terminal, and a second output connected to the second output terminal, the first amplifier reproducing the input signal on the first output. The amplifier comprises a second amplifier having a first input receiving a reference signal and a second input connected to the output terminals by resistive elements and controlling the provision by the first amplifier on the second output of a signal such that the signals received at the first and second inputs of the second amplifier are equal.

19 Claims, 3 Drawing Sheets

DIFFERENTIAL AMPLIFIER WITH TWO OUTPUTS AND A SINGLE INPUT OF IMPROVED LINEARITY

PRIORITY CLAIM

This application claims priority from French patent application No. 04/50641, filed Mar. 31, 2004, which is incorporated herein by reference.

BACKGROUND OF THE INVENTION

1. Field of the Invention

The present invention relates generally to a differential amplifier with two outputs and a single input. Such an amplifier provides across the two output terminals a voltage proportional to the difference between a voltage received at the input terminal and a reference voltage. Such an amplifier is for example used in a digital versatile disk (DVD) reader.

2. Discussion of the Related Art

FIG. 1 schematically shows a conventional differential amplifier circuit with two outputs and a single input.

Amplifier 10 comprises an input terminal IN on which is applied a voltage $V_{IN}$ referenced to a reference potential GND, for example, the ground, and two output terminals OUT− and OUT+ respectively providing voltages $V_{O-}$ and $VO_+$, also referenced to reference potential GND. Amplifier 10 comprises a first operational amplifier 12 comprising a non-inverting input (+) connected to terminal IN and an inverting input (−) connected to terminal S of amplifier 12. Amplifier 10 comprises a second operational amplifier 14 comprising an inverting input (−) connected to output S of the first amplifier 12 via a resistor 16 of value R1. The output and the inverting input (−) of operational amplifier 14 are connected via a resistor 18 of value R2. Output terminal OUT− of amplifier 10 corresponds to the output of operational amplifier 14. Operational amplifier 14 comprises a non-inverting input (+) connected to a terminal of a generator 20 of a reference voltage $V_{REF}$ having its other terminal connected to reference potential GND. Second output OUT+ of amplifier 10 is connected to output S of operational amplifier 12.

Since first operational amplifier 12 is connected as a follower, the voltage at output S, referenced with respect to reference potential GND, is equal to $V_{IN}$. $V_{O+}$ is thus equal to $V_{IN}$. Since second amplifier 14 is connected as an inverter amplifier, $V_{O-}$ is equal to $(1+R2/R1)V_{REF}-(R2/R1)V_{O+}$.

Voltage $V_{OUT}$ between output terminals OUT+ and OUT− thus is in phase with $V_{IN}$ and has an amplitude substantially equal to the difference between $V_{REF}$ and $V_{IN}$ multiplied by an amplification factor $1+R2/R1$. Such an amplifier thus provides a voltage $V_{OUT}$ having a peak-to-peak amplitude equal to the peak-to-peak amplitude of $V_{IN}$ multiplied by amplification factor $1+R2/R1$. Further, since $V_{OUT}$ is obtained from the difference between $V_{O+}$ and $V_{O-}$, it is free of the noise present at the level of reference potential GND with respect to which $V_{IN}$ is referenced. Further, voltage $V_{IN}$ generally arrives onto the gate of the MOS transistor or the base of a bipolar transistor, according to the technology used to form operational amplifier 12. Amplifier 10 thus has a very high input impedance.

A disadvantage of such an amplifier is that it is not perfectly linear. Indeed, there generally exists a slight delay between $V_{O-}$ and $V_{O+}$. Further, voltage $V_{O-}$ may be disturbed by specific noise, due to the resistances and to the different components of operational amplifier 14 which are present at the level of $V_{OUT}$. Further, such an amplifier does not have a common mode control for both outputs OUT+ and OUT−. Finally, operational amplifier 14 generally introduces an additional phase and amplitude distortion of $V_{O-}$ with respect to $V_{O+}$. As an example, the total harmonic distortion (THD) may be greater than 30 decibels for a maximum frequency smaller than 100 MHz. The linearity properties of such an amplifier may thus be insufficient for certain applications, for example, for a digital versatile disk (DVD) reader or for liquid crystal display control circuits.

SUMMARY OF THE INVENTION

An embodiment of the present invention is a differential amplifier with two outputs and a single input having improved linearity properties.

Specifically, this embodiment of the differential amplifier has first and second output terminals and receives an input signal at an input terminal, comprising:

a first amplifier having a first input connected to the input terminal, a second input and a first output connected together to the first output terminal, and a second output connected to the second output terminal, the first amplifier reproducing the input signal on the first output; and a second amplifier having a first input receiving a reference signal and a second input connected to the first output terminal by a first resistive element and to the second output terminal by a second resistive element, said second amplifier controlling the provision by the first amplifier on the second output of a signal such that the signals received at the first and second inputs of the second amplifier are equal.

According to an embodiment of the present invention, the first amplifier comprises:

at least first and second input transistors connected as a differential pair and respectively controlled by the signals received at the first and second inputs of the first amplifier;

a first output stage connected to the first output of the first amplifier and to the first input transistor and driven by a first power source controlled by the second amplifier; and a second output stage connected to the second output of the first amplifier and to the second input transistor and driven by a second power source controlled by the second amplifier.

According to an embodiment of the present invention, the at least first and second input transistors comprise a first input MOS transistor having its gate connected to the first input of the first amplifier and a second input MOS transistor having its gate connected to the second input of the first amplifier.

According to an embodiment of the present invention, the first amplifier comprises a first output MOS transistor having its gate connected to the source or to the drain of the first input MOS transistor and having its source or drain connected to the first output of the first amplifier and a second output MOS transistor having its gate connected to the source or to the drain of the second input MOS transistor and having its source or its drain connected to the second output of the first amplifier.

According to an embodiment of the present invention, the first controlled power source comprises a first controlled current source connected to the gate of the first output transistor and the second controlled power source comprises a second controlled current source connected to the gate of the second output transistor.

According to an embodiment of the present invention, the first amplifier comprises first and second cascode MOS transistors having their gates connected to a source of a constant voltage, the first cascode MOS transistor being interposed between the first controlled current source and the gate of the first output transistor, the second cascode MOS transistor being interposed between the second controlled current source and the gate of the second output transistor.

According to an embodiment of the present invention, the first and second input MOS transistors are of type N, the first amplifier further comprising third and fourth P-type input MOS transistors connected as a differential pair, the gate of the third input transistor being connected to the first input of the first amplifier and the gate of the fourth input transistor being connected to the second input of the first amplifier.

According to an embodiment of the present invention, the drain of the first input MOS transistor and the drain of the third input MOS transistor are connected to different terminals from among the drain and the source of the first cascode transistor and the drain of the second input MOS transistor and the drain of the fourth input MOS transistor are connected to different terminals from among the drain and the source of the second cascode transistor.

Features and advantages of the present invention will be discussed in detail in the following non-limiting description of specific embodiments in connection with the accompanying drawings.

DETAILED DESCRIPTION

Figure 2:
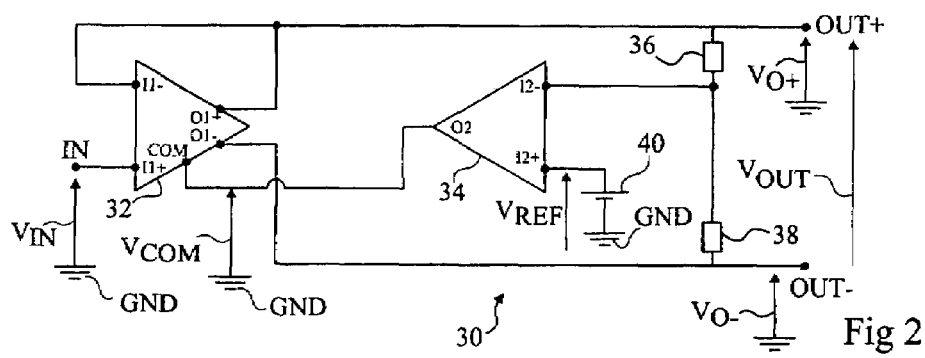
FIG. 2 schematically shows an example of the forming of a differential amplifier with two outputs and a single input according to an embodiment of the present invention.

FIG. 2 schematically shows an example of the forming of a differential amplifier 30 according to an embodiment of the present invention. Amplifier 30 comprises an input terminal IN receiving an input voltage $V_{IN}$ referenced to a reference potential GND, for example, the ground, and two output terminals OUT+, OUT− providing output voltages $V_{O+}$ and $V_{O-}$ referenced to reference potential GND. Amplifier 30 comprises a first differential amplifier 32 having an inverting input I1−, a non-inverting input I1+, an inverting output O1−, and a non-inverting output O1+. Input terminal IN is connected to non-inverting input I1+. Inverting input I1− is connected to non-inverting input O1+. Non-inverting input O1+ is connected to output terminal OUT+. Inverting output O1− is connected to output terminal OUT−. Amplifier 30 comprises a second differential amplifier 34 comprising an inverting input I2− connected to output terminal OUT+ via a resistor 36 of value R1 and to output terminal OUT− via a resistor 38 of value R2. Amplifier 34 comprises a non-inverting input I2+ connected to a terminal of a generator 40, providing a reference voltage $V_{REF}$, having its other input connected to reference potential GND. Amplifier 34 provides, to an output O2, a voltage $V_{COM}$ to an input COM of amplifier 32. The power supplies of amplifiers 32, 34 are not shown.

The operation of amplifier 30 according to an embodiment of the present invention is the following: first amplifier 32 operates, for output O1+, as a follower so that the voltage at output O1+, that is, $V_{O+}$, is equal to voltage $V_{IN}$. Further, second amplifier 34 controls first amplifier 32 via signal $V_{COM}$ so that first amplifier 32 provides a voltage $V_{O-}$ such that the voltages at inputs I2− and I2+ of the second amplifier are equal, that is, a voltage $V_{O-}$ equal to $(1+R2/R1)V_{REF}-(R2/R1)V_{O+}$. $V_{OUT}$ is thus equal to the difference between $V_{IN}$ and $V_{REF}$ multiplied by an amplification factor $1+R2/R1$.

Figure 1:
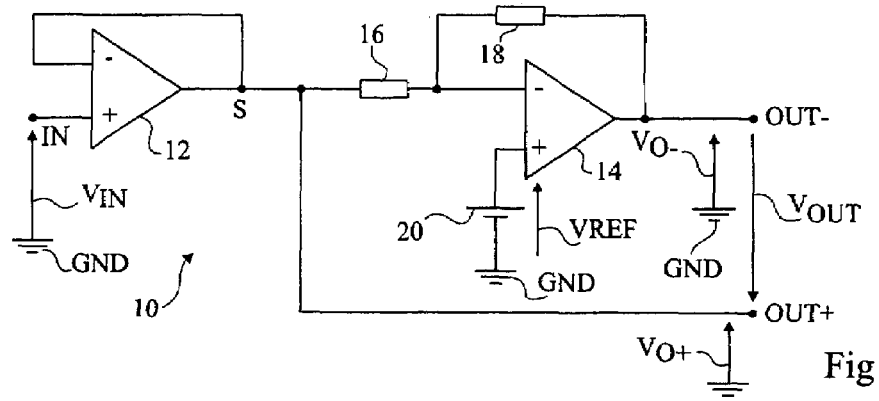
FIG. 1, previously described, schematically shows the circuit of a conventional differential amplifier with two outputs and a single input.

Amplifier 30 according to an embodiment of the present invention has a high input impedance since voltage $V_{IN}$ is applied to the gate of a MOS transistor, or to the base of a bipolar transistor, according to the structure of first differential amplifier 32. Further, the common mode control of outputs OUT+ and OUT− is inherent to the structure. Moreover, amplifier 30 according to an embodiment of the present invention has improved linearity properties as compared to a conventional amplifier such as that shown in FIG. 1. Indeed, since voltages $V_{O+}$ and $V_{O-}$ are obtained by similar paths, any delay of $V_{O-}$ with respect to $V_{O+}$ and any specific distortion or disturbance by specific unwanted noise of $V_{O-}$ with respect to $V_{O+}$ are limited. As an example, the total harmonic distortion (THD) is divided by at least a factor 10 with respect to that of the amplifier shown in FIG. 1.

Figure 3:
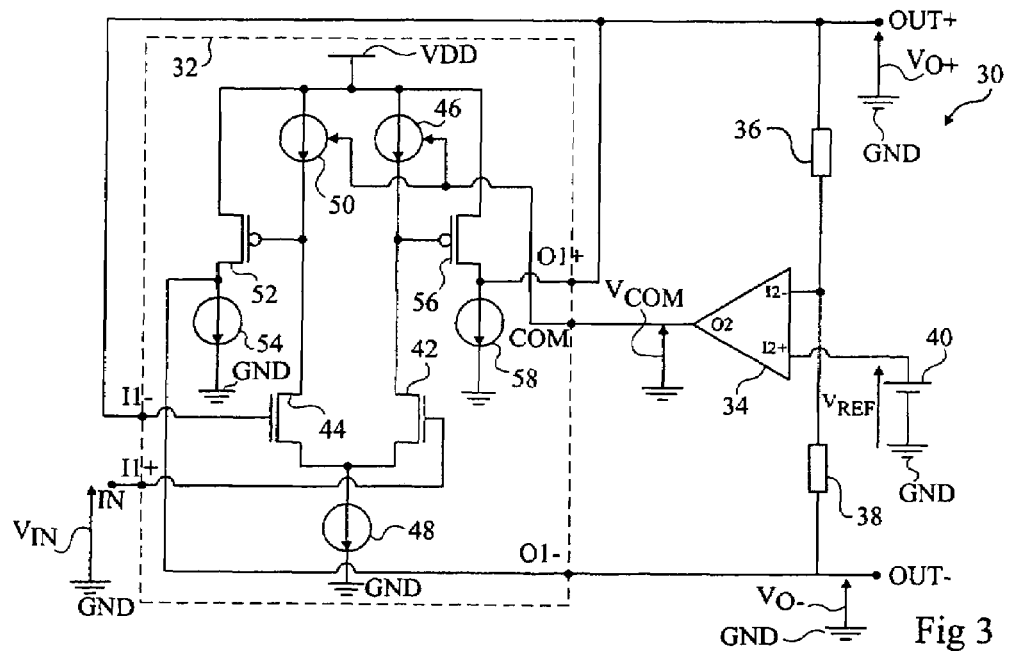
FIGS. 3 to 5 schematically show three more detailed examples of the forming of the differential amplifier of FIG. 2 according to respective embodiments of the present invention.

FIG. 3 shows amplifier 30 according to a first more detailed example of the forming of first differential amplifier 32. Amplifier 32 comprises a differential pair formed of two N-channel MOS transistors 42, 44. Input I1+ is connected to the gate of transistor 42. The drain of transistor 42 is connected to a terminal of a controlled current source 46 having its other terminal connected to a potential VDD, greater than potential GND. The source of transistor 42 is connected to a terminal of a current source 48 having its other terminal connected to potential GND. Input I1− is connected to the gate of transistor 44. The source of transistor 44 is connected to the source of transistor 42. The drain of transistor 44 is connected to a terminal of a controlled current source 50 having its other terminal connected to potential VDD. Controlled current sources 46, 50 are driven by voltage $V_{COM}$ provided by amplifier 34 so that controlled current sources 46, 50 substantially provide a current of same intensity when they are controlled by a same voltage $V_{COM}$ and that, as $V_{COM}$ increases, the currents provided by controlled current sources 46, 50 decrease.

Amplifier 32 comprises a P-type MOS transistor 52 having its gate connected to the drain of transistor 44, having its source connected to potential VDD, and having its drain connected to a terminal of a constant current source 54 having its other terminal connected to potential GND. Similarly, amplifier 32 comprises a P-type MOS transistor 56 having its gate connected to the drain of transistor 42, having its source connected to potential VDD, and having its drain connected to a terminal of a constant current source 58 having its other terminal connected to potential GND. Constant current sources 54, 58 provide a current of same amplitude. Non-inverting output O1+ corresponds to the drain of transistor 56. Inverting output O1− corresponds to the drain of transistor 52.

Second differential amplifier 34 has a conventional structure. It comprises, for example, a differential pair of P-type MOS transistors having their gates respectively connected to inputs I2− and I2+, output O2 being connected to the drain of the transistor having its gate connected to I2−. Conventionally, constant current sources 48, 54, 58 and controlled current sources 46, 50 may be formed of MOS transistors. In particular, controlled current sources 46, 50 may each be formed of a P-type MOS transistor having its gate controlled by the output of amplifier 34.

The operation of amplifier 30 is the following. The differential pair of first differential amplifier 32, formed by transistors 42, 44, imposes the equality between the voltages at inputs I1– and I1+, that is, the equality between voltages $V_{O+}$ and $V_{IN}$. Second differential amplifier 34 controls controlled current sources 46, 50 so that the voltage at inverting input I2– is equal to the voltage at non-inverting input I2+, that is, $V_{O-}$ is equal to $2V_{REF}-V_{O+}$, that is, voltages $V_{O+}$ and $V_{O-}$ vary symmetrically with respect to $V_{REF}$ in the case where value R1 of resistor 36 is equal to value R2 of resistor 38. The control of controlled current sources 46, 50, is performed by a negative control loop. If the voltage at inverting input I2– increases (respectively, decreases) with respect to the voltage at non-inverting input I2+, then voltage $V_{COM}$ decreases (respectively, increases) and the currents provided by controlled current sources 46, 50 increase (respectively, decrease). The voltages applied on the gates of transistors 52, 56 then increase (respectively, decrease) and $V_{O+}$ and $V_{O-}$ decrease (respectively increase), which results in a decrease (respectively, an increase) in the voltage at inverting input I2–.

Figure 4:
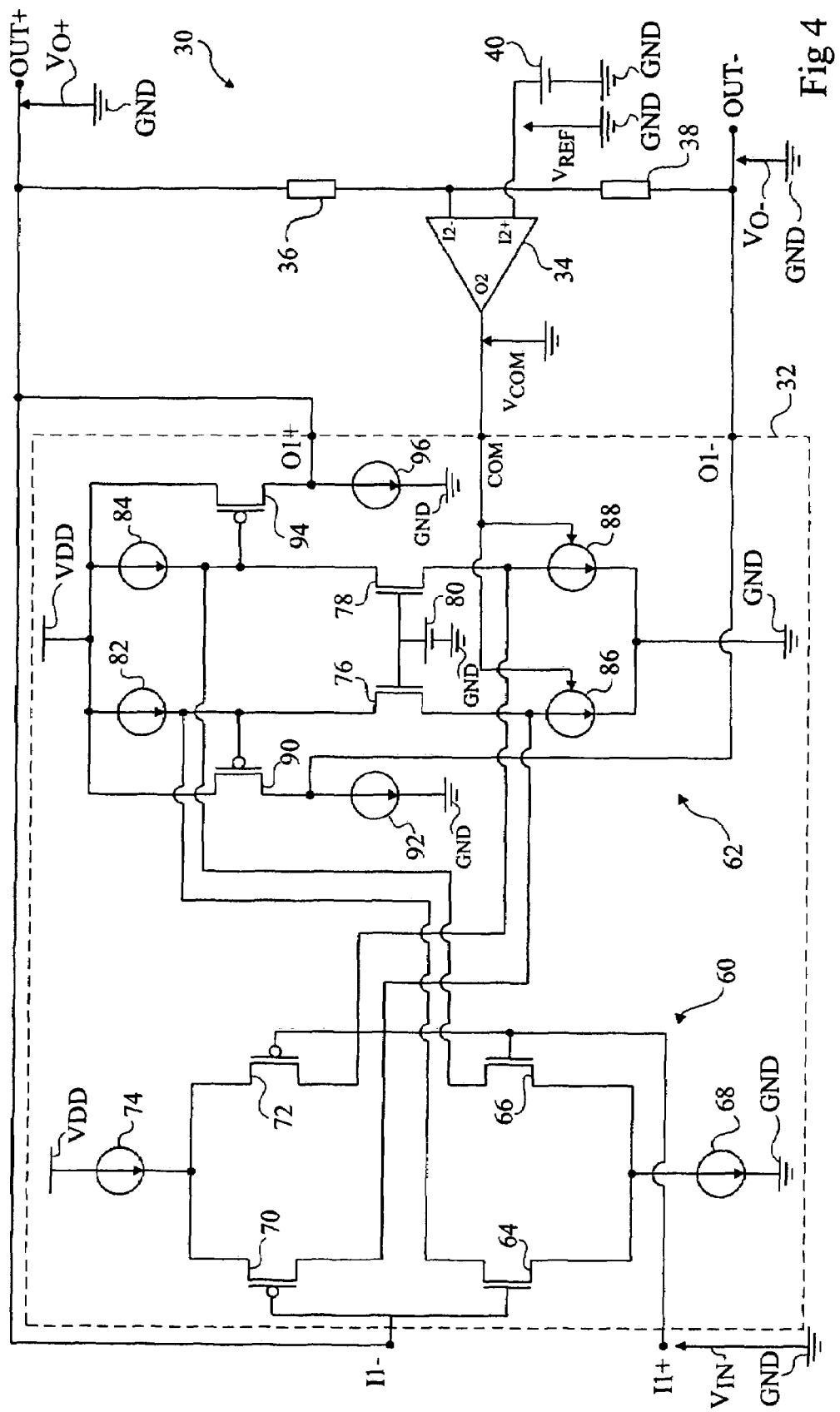

FIG. 4 shows amplifier 30 according to a second more detailed example of the forming of first differential amplifier 32. Differential amplifier 32 comprises a "rail-to-rail"-type input stage 60 and an output stage 62.

Input stage 60 comprises two differential pairs. The first differential pair is formed of two N-type MOS transistors 64, 66 having their sources connected to a terminal of a constant current source 68 having its other terminal connected to reference potential GND. The second differential pair is formed of two P-type MOS transistors 70, 72 having their sources connected to a terminal of a constant current source 74 having its other terminal connected to potential VDD. Constant current sources 68, 74 provide a current of same intensity. The gates of transistors 64, 70 are connected to input I1–. The gates of transistors 66, 72 are connected to input I1+.

Output stage 62 comprises two cascode-connected N-type MOS transistors 76, 78. These are two transistors 76, 78 having their gates connected in common to a terminal of a voltage source 80 having its other terminal connected to potential GND. The drain of transistor 76 is connected to a terminal of a constant current source 82 having its other terminal connected to potential VDD. The drain of transistor 78 is connected to a terminal of a constant current source 84 having its other terminal connected to potential VDD. Constant current sources 82, 84 provide a current of same intensity. The source of transistor 76 is connected to a terminal of a controlled current source 86 having its other terminal connected to potential GND. The source of transistor 78 is connected to a terminal of a control current source 88 having its other terminal connected to potential GND. Controlled current sources 86, 88 are controlled by voltage $V_{COM}$ provided by amplifier 34 and substantially provide a current of same intensity when they are controlled by a same voltage $V_{COM}$. Further, as $V_{COM}$ increases, the currents provided by controlled current sources 86, 88 increase. Stage 62 comprises a P-type MOS transistor 90 having its gate connected to the drain of transistor 76, having its source connected to potential VDD, and having its drain connected to a terminal of a constant current source 92 having its other terminal connected to potential GND. Similarly, output stage 62 comprises a P-type MOS transistor 94 having its gate connected to the drain of transistor 78, having its source connected to potential VDD, and having its drain connected to a terminal of a constant current source 96 having its other terminal connected to potential GND. Constant current sources 92, 96 provide a current of same intensity. The drains of P-type MOS transistors 70, 72 are respectively connected to the sources of N-type MOS transistors 76, 78. The drains of N-type MOS transistors 64, 66 are respectively connected to the drains of transistors 76, 78. Output O1+ of differential amplifier 32 corresponds to the drain of transistor 94. Output O1– of amplifier 32 corresponds to the drain of transistor 90. Controlled current sources 86, 88 may each be formed of an N-type MOS transistor having its gate controlled by the output of amplifier 34.

Similarly to the first example of embodiment associated with FIG. 3, the equality between $V_{IN}$ and the voltage on input I1– of amplifier 32 is obtained by the differential pairs of first stage 60. Similarly, the equality between the voltages at inputs I2– and I2+ of amplifier 34, which corresponds to the fact that $V_{O-}$ is the symmetrical of $V_{O+}$ with respect to $V_{REF}$ when resistors 36 and 38 have the same value, is obtained by the control of controlled current sources 86, 88 by amplifier 34.

Further, the second example has additional advantages. First stage 60 comprises two differential pairs arranged according to a currently-called "rail-to-rail" assembly. Such an assembly enables using a voltage $V_{IN}$, the peak-to-peak amplitude of which can be twice the peak-to-peak amplitude of the voltage $V_{IN}$ usable with the first example of embodiment. The "rail-to-rail" assembly of input stage 60 enables inserting cascode-connected transistors 76, 78, which enables isolating controlled current sources 86, 88. The variations of the potentials respectively applied to the gates of transistors 90, 94 which respectively follow the variations of voltages $V_{O-}$ and $V_{O+}$ are then not substantially sensed by controlled current sources 86, 88. Indeed, the voltages of the sources of cascode-connected transistors 76, 78 are practically insensitive to variations of the voltages applied to the gates of transistors 90 and 94. This enables still further improving the linearity properties of amplifier 30, and especially dividing by a factor of at least 10 the total harmonic distortion (THD) of amplifier 30 according to the second example with respect to the first example of embodiment.

According to an alternative of the second example, cascode-connected transistors may be provided between current sources 82, 84 and the drains of transistors 76, 78, with the gates of the transistors 90 and 94 coupled between the respective pairs of cascade-connected transistors.

Figure 5:
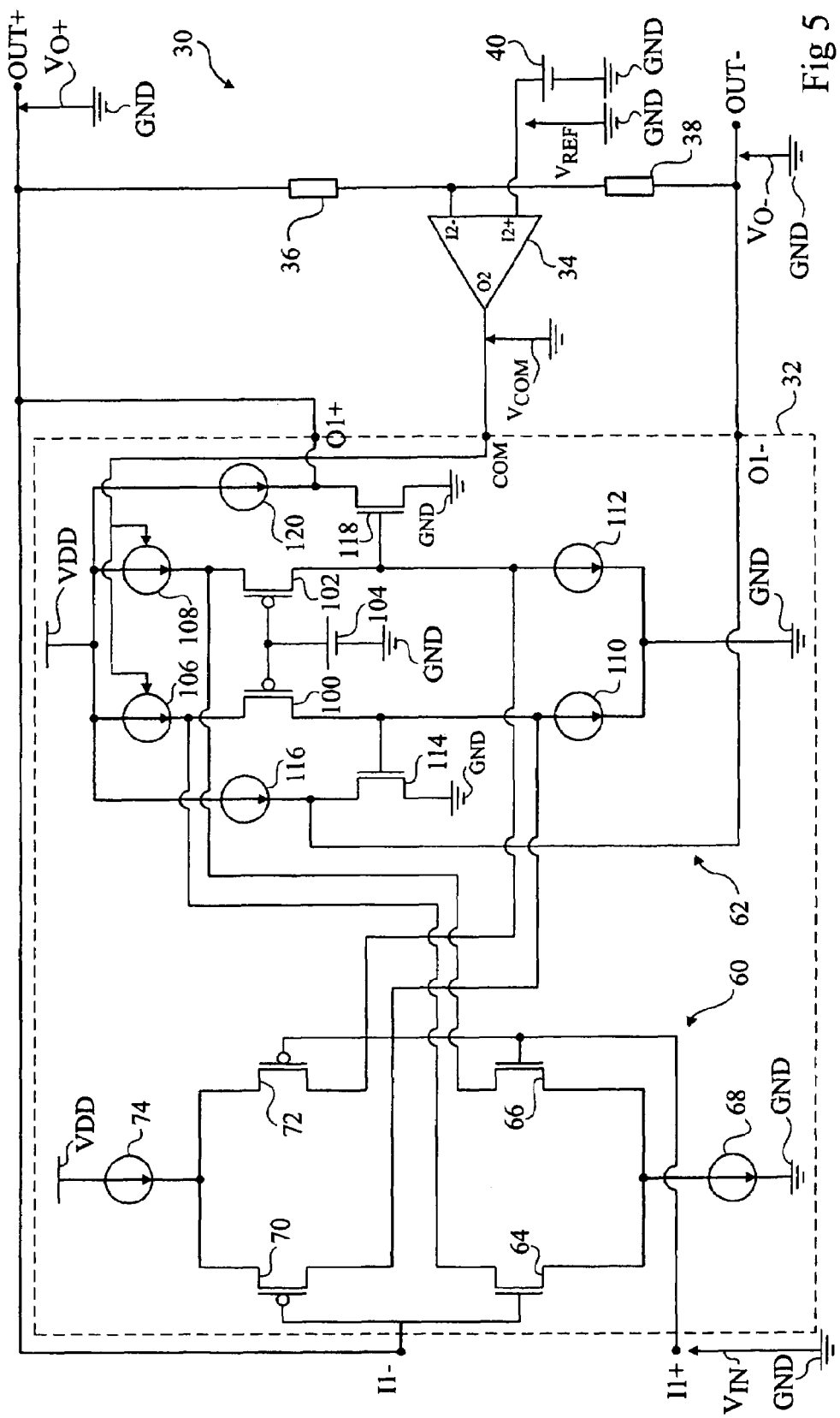

FIG. 5 shows amplifier 30 according to a third more detailed example of the forming of first differential amplifier 32. Output stage 62 comprises cascode-connected P-type MOS transistors 100, 102, that is, transistors having their gates connected to a terminal of a voltage source 104 having its other terminal connected to potential GND. The source of transistor 100 is connected to a terminal of a controlled current source 106 having its other terminal connected to potential VDD. The source of transistor 102 is connected to a terminal of a controlled current source 108 having its other terminal connected to potential VDD. Controlled current sources 106, 108 are controlled by voltage $V_{COM}$ provided by amplifier 34 and substantially provide a current of same intensity when they are controlled by a same voltage $V_{COM}$. Further, as $V_{COM}$ increases, the currents provided by controlled current sources 106, 108 decrease. The drain of transistor 100 is connected to a terminal of a constant current source 110 having its other terminal connected to potential GND. The drain of transistor 102 is connected to a terminal of a constant current source 112 having its other terminal connected to potential GND. Constant current sources 110, 112 provide a current of same intensity. Output stage 62 comprises an N-type MOS transistor 114 having its gate connected to the drain of transistor 100, having its source connected to potential GND, and having its drain connected to a terminal of a constant current source 116 having its other terminal connected to potential VDD. Output stage 62 comprises an N-type transistor 118 having its gate connected to the drain of transistor 102, having its source connected to potential GND, and having its drain connected to a terminal of a constant current source 120 having its other terminal connected to potential VDD. Constant current sources 116, 120 substantially provide a current of same intensity. The drains of transistors 64, 66 are respectively connected to the sources of transistors 100, 102 and the drains of transistors 70, 72 are respectively connected to the drains of transistors 100, 102. Output O1+ of amplifier 32 is connected to the drain of transistor 118. Output O1− of amplifier 32 is connected to the drain of transistor 114. Controlled current sources 106, 108 may each be formed of a P-type MOS transistor having its gate controlled by the output of amplifier 34.

According to an alternative of the third example of embodiment, cascode-connected transistors may be provided between current sources 110, 112 and the drains of transistors 100, 102, with the gates of the transistors 114 and 118 coupled between the respective pairs of cascade-connected transistors.

The third example of amplifier 30 substantially corresponds to the second detailed example in which the N-type MOS transistors of output stage 62 are replaced with P-type MOS transistors and conversely. It operates similarly to the second example and has the advantages thereof.

The amplifier 30 may be disposed on an integrated circuit, which may be incorporated in an electronic system.

Of course, the present invention is likely to have various, alterations, improvements, and modifications which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A differential amplifier having first and second output terminals and receiving an input signal at an input terminal, comprising:
    a first amplifier having a first input connected to the input terminal, a second input and a first output connected together to the first output terminal, and a second output connected to the second output terminal, the first amplifier reproducing the input signal on the first output; and
    a second amplifier having a first input receiving a reference signal and a second input connected to the first output terminal through a first resistive element and to the second output terminal through a second resistive element, said second amplifier controlling the provision by the first amplifier on the second output of a signal such that the signals received at the first and second inputs of the second amplifier are equal.

2. The amplifier of claim 1, wherein the first amplifier comprises:
    at least first and second input transistors connected as a differential pair and respectively controlled by the signals received at the first and second inputs of the first amplifier;
    a first output stage connected to the first output of the first amplifier and to the first input transistor and driven by a first power source controlled by the second amplifier; and
    a second output stage connected to the second output of the first amplifier and to the second input transistor and driven by a second power source controlled by the second amplifier.

3. The amplifier of claim 2, wherein said at least first and second input transistors comprise a first input MOS transistor having a gate connected to the first input of the first amplifier and a second input MOS transistor having a gate connected to the second input of the first amplifier.

4. The amplifier of claim 3, wherein the first amplifier comprises a first output MOS transistor having a gate connected to a source or a drain of the first input MOS transistor and having a source or drain connected to the first output of the first amplifier and a second output MOS transistor having a gate connected to a source or a drain of the second input MOS transistor and having a source or a drain connected to the second output of the first amplifier.

5. The amplifier of claim 3, wherein the first controlled power source comprises a first controlled current source connected to the gate of the first output transistor and the second controlled power source comprises a second controlled current source connected to the gate of the second output transistor.

6. The amplifier of claim 4, wherein the first amplifier comprises first and second cascode MOS transistors having gates connected to a source of a constant voltage, the first cascode MOS transistor being interposed between the first controlled current source and the gate of the first output transistor, the second cascode MOS transistor being interposed between the second controlled current source and the gate of the second output transistor.

7. The amplifier of claim 3, wherein the first and second input MOS transistors are of N type, the first amplifier further comprising third and fourth P-type input MOS transistors connected as a differential pair, a gate of the third input transistor being connected to the first input of the first amplifier and a gate of the fourth input transistor being connected to the second input of the first amplifier.

8. The amplifier of claim 6, wherein a drain of the first input MOS transistor and a drain of the third input MOS transistor are connected to different terminals from among the drain and the source of the first cascode transistor and the drain of the second input MOS transistor and the drain of the fourth input MOS transistor are connected to different terminals from among the drain and the source of the second cascode transistor.

9. An amplifier, comprising:
    a first stage operable to receive a single-ended input signal and to generate a differential output signal having a bias component by amplifying the input signal; and
    a second stage coupled to the first stage and operable to maintain the bias component substantially at a predetermined level.

10. The amplifier of claim 9 wherein the first stage comprises:
    a first input node operable to receive the input signal;
    a second input node;

first and second output nodes operable to carry the differential output signal, one of the output nodes coupled to the second input node.

11. The amplifier of claim 9, further comprising:
a signal divider operable to receive the differential output signal and to extract the bias component of the differential output signal;
wherein the second stage is coupled to the signal divider and is operable to compare the bias component to a predetermined reference level.

12. The amplifier of claim 9, further comprising:
a signal divider operable to receive the differential output signal and to extract the bias component of the differential output signal;
wherein the second stage is coupled to the signal divider and is operable to compare the bias component to a predetermined reference level and to control the first stage such that the bias component substantially equals the predetermined reference level.

13. The amplifier of claim 9 wherein the input signal, the output signal, and the bias component respectively comprise an input voltage, an output voltage, and a bias voltage.

14. The amplifier of claim 9 wherein:
the bias component comprises a common-mode component;
the first stage further comprises a bias generator and first and second differential amplification branches respectively having first and second output nodes and coupled to the bias generator, the first and second branches operable to generate the differential output signal across the first and second output nodes and to generate the common-mode component on each of the output nodes; and
the second stage is operable to maintain the common-mode component at substantially the predetermined level by controlling the bias generator.

15. An integrated circuit, comprising:
an amplifier stage operable to receive a single-ended input signal and to generate a differential output signal having a bias component by amplifying the input signal; and
a bias-control stage coupled to the amplifier stage and operable to maintain the bias component substantially at a predetermined level.

16. An electronic system, comprising:
an integrated circuit including,
an amplifier stage operable to receive a single-ended input signal and to generate a differential output signal having a bias component by amplifying the input signal, and
a bias-control stage coupled to the amplifier stage and operable to maintain the bias component substantially at a predetermined level.

17. A method, comprising:
generating a differential output signal having a common-mode component by amplifying a single-ended input signal; and
maintaining the common-mode component substantially at a predetermined level.

18. The method of claim 17 wherein maintaining the common-mode component comprises adjusting the common-mode component in response to a difference between the common-mode component and the predetermined level.

19. The method of claim 17 wherein:
generating the differential output signal comprises generating the differential output signal with an amplifier stage; and
maintaining the common-mode component comprises controlling a common-mode bias current for the amplifier stage response to a difference between the common-mode component and the predetermined level.

* * * * *